United States Patent [19]
McLaury

[11] Patent Number: 5,654,933
[45] Date of Patent: Aug. 5, 1997

[54] EQUILIBRATED SAM READ TRANSFER CIRCUIT

[75] Inventor: Loren L. McLaury, Boise, Id.

[73] Assignee: Micron Technology, Inc., Boise, Id.

[21] Appl. No.: 785,801

[22] Filed: Jan. 21, 1997

Related U.S. Application Data

[63] Continuation of Ser. No. 497,540, Jun. 30, 1995, abandoned

[51] Int. Cl.⁶ .................................................. G11C 7/00
[52] U.S. Cl. .................. 365/230.05; 365/190; 365/202; 365/207
[58] Field of Search ........................ 365/202, 207, 365/189.09, 203, 230.05, 190, 149

[56] References Cited

U.S. PATENT DOCUMENTS

| | | | |
|---|---|---|---|
| 4,891,794 | 1/1990 | Hush et al. | 365/189.04 |
| 5,235,545 | 8/1993 | McLaury | 365/189.04 |
| 5,265,050 | 11/1993 | McLaury | 365/189.01 |
| 5,282,177 | 1/1994 | McLaury | 365/230.05 |
| 5,311,478 | 5/1994 | Zagar et al. | 365/230.06 |
| 5,323,350 | 6/1994 | McLaury | 365/208 |
| 5,325,502 | 6/1994 | McLaury | 395/425 |
| 5,369,622 | 11/1994 | McLaury | 365/233 |
| 5,394,172 | 2/1995 | McLaury | 345/200 |
| 5,402,378 | 3/1995 | Min et al. | 365/202 |
| 5,418,748 | 5/1995 | Monden | 365/202 X |
| 5,487,043 | 1/1996 | Furutani et al. | 365/207 X |
| 5,506,811 | 4/1996 | McLaury | 365/207 X |

OTHER PUBLICATIONS

"VRAM—256lx8 DRAM with 512x8 SAM;" *Specialty DRAM —Graphics/Communications 1993 Data Book;* Micron Semiconductor, Inc.; pp. 2–139 –2–180 (1993).

*Primary Examiner*—Do Hyun Yoo
*Attorney, Agent, or Firm*—Schwegman, Lundberg, Woessner & Kluth, P.A.

[57] ABSTRACT

A circuit and method are described for transferring data from a dynamic random access memory (DRAM) to a serial access memory (SAM). The SAM includes an equilibration circuit and a bias circuit for equilibrating the SAM to a predetermined potential prior to transferring data. Data is transferred to the SAM by creating a differential voltage on the SAM and using the differential to latch the state of the data in the SAM.

6 Claims, 6 Drawing Sheets

EQUILIBRATED SAM READ TRANSFER CIRCUIT

This is a continuation of application Ser. No. 08/497,540, filed Jun. 30, 1995, now abandoned.

TECHNICAL FIELD OF THE INVENTION

The present invention relates generally to integrated circuit memories and in particular the present invention relates reading data stored in a dynamic memory using an equilibrated serial memory.

BACKGROUND OF THE INVENTION

Multi-port random access memories (RAM) are substantially faster than standard RAM and commonly referred to as video random access memories (VRAM) because of their effectiveness in video systems. In its simplest form, a multi-port memory includes a dynamic random access memory (DRAM), a DRAM controller, at least one serial memory and a serial memory controller. Each serial memory is essentially a long shift register which can receive a block of data from the DRAM and serially shift the data out through a data port. Each serial memory can also serially shift data in through the serial ports and transfer data to the DRAM.

The DRAM is a dynamic array for storing multiple bit registers in multiple two dimensional planes each having rows and columns. Each bit register is defined by the same row and column addresses in each of the planes. Each serial memory has a bit register row associated with one of each of the planes of the DRAM such that the columns of the DRAM correspond to the bits of the register row.

In general, the DRAM and serial memory can operate either independently or in combination for internal transfers of data. When operating in combination, the serial memory is structured to allow access to one row of the DRAM. In a DRAM having 512 column addresses in each row, a serial memory can read or write to addresses 0–511 of one row of the DRAM. This configuration allows for both bi-directional internal transfer of data between the DRAM and the serial memory and independent access to each memory.

The DRAM is comprised of an arrangement of individual memory cells. Each memory cell typically comprises a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output lines through transistors used as switching devices. For each bit of data stored, its true logic state is available on an I/O line and its complementary logic state is available at on an I/O compliment line. Thus, each memory cell has two digit lines, digit and digit complement.

Typically, the memory cells are arranged in an array and each cell has an address identifying its location in the array. The array comprises a configuration of intersecting rows with a memory cell at each intersection. In order to read from, or write to a cell, the particular cell in question must be addressed. The address for the memory cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

As stated, conventional dynamic memories use memory cells fabricated as capacitors in an integrated circuit to store data. That is, a logical "1" is stored as a charge on the capacitor and the capacitor is discharged for a logical "0". The pairs of digit lines are connected to both memory cells and sense amplifiers. These sense amplifiers are utilized to sense small differentials on the digit lines and drive the digit lines to full power supply rails for either reading the memory cells or writing thereto. Once the data has been sensed it can be transmitted to a serial memory via the digit line pairs.

In general, to transfer data from a DRAM to a serial memory, such as a serial access memory (SAM), the data stored in the DRAM is sensed and then the memories are connected. If the prior data stored on the SAM is a different state than the data being transferred from the DRAM, the DRAM must over-write the SAM. This operation is both time consuming and requires a substantial mount of current.

For the reasons stated above, and for other reasons stated below which will become apparent to those skilled in the art upon reading and understanding the present specification, there is a need in the art for a fast, low power read transfer from a dynamic memory to a static memory.

SUMMARY OF THE INVENTION

The above mentioned problems with read transfers from a dynamic memory and other problems are addressed by the present invention and which will be understood by reading and studying the following specification. A static memory is described which includes equilibration circuitry that increases the speed of data read transfers while reducing current requirements.

In particular, the present invention describes an equilibration circuit which is coupled to a static memory for equilibrating the static memory to a predetermined potential. In one embodiment an integrated memory circuit comprises a plurality of dynamic memory cells, a plurality of static memory cells selectively coupled to the plurality of dynamic memory cells, and an equilibrate circuit connected to the plurality of static memory cells for equilibrating the plurality of static memory cells to a predetermined potential. The equilibrate circuit can be a transistor which is connected to first and second nodes of the static memory cells. Further, the integrated memory circuit can includes a bias circuit for electrically coupling the static memory to a predetermined potential.

In another embodiment, a multi-port memory comprises a dynamic random access memory (DRAM) having dynamic memory cells selectively coupled to a digit line, a p-sense amplifier and an n-sense amplifier connected to the digit line. A serial access memory (SAM) having a plurality of static memory cells is selectively coupled to the digit line, and an equilibrate circuit is connected to the plurality of static memory cells for equilibrating the plurality of static memory cells to a predetermined potential.

In still another embodiment, a method of transferring data from a dynamic memory to a static memory comprises the steps of equilibrating the static memory, coupling the static memory to the dynamic memory. After the static memory is coupled the dynamic memory, a differential voltage is imparted on the static memory, and the data is stored in the static memory.

An alternate method of transferring data from a dynamic memory to a static memory having a pull-up circuit and a pull-down circuit comprises the steps of disabling the pull-up and pull-down circuits, and equilibrating the static memory to a pre-determined potential. The static memory is then coupled to the dynamic memory and a differential voltage is imparted on the static memory. The static memory is de-coupled from the dynamic memory and both the pull-down and pull-up circuits are re-activated.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
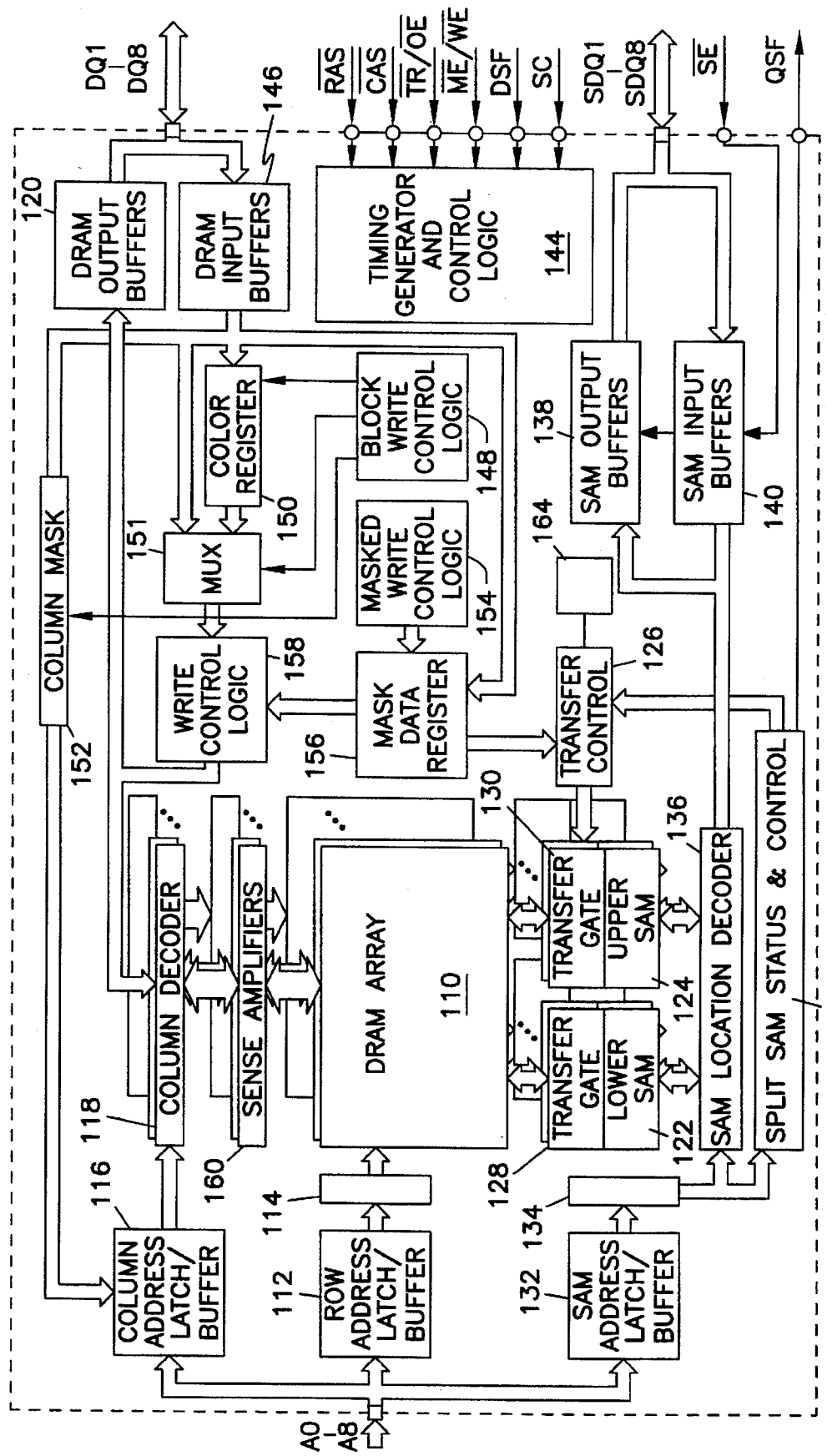
FIG. 1 is a block diagram of a multi-port memory incorporating the present invention.

FIG. 1 illustrates a block diagram of a multi-port memory incorporating the present invention. The multi-port memory is similar to the VRAM available as part number MT42C8256 produced by Micron Technology Inc., Boise, Id., the assignee of the present invention. A complete description of this memory can be found in Micron Semiconductor, Inc. Data Book, page 2-139 to 2-179 (1993).

DRAM 110 is a 512 by 512 by 8 bit array which can be accessed by a microprocessor (not shown) through input/output connections including address lines A0–A8. Row address latch/buffer 112 and row decoder 114 decode a row address from a row address signal provided on A0–AS, and address the corresponding row of the DRAM. Likewise, column address latch/buffer 116 and column decoder 118 decode a column address from a column address signal provided on A0–A8, and address the corresponding column of the DRAM. Data stored in the DRAM 110 can be transferred to outputs DQ1–DQ8 through DRAM output buffers 120.

Two 256×8 bit serial access memories, SAM's 122 and 124, are provided as independent memories and connected to the DRAM for internal transfers of data. SAM 122 is dedicated to internal transfers with DRAM 110 column addresses 0 through 255 and SAM 124 is dedicated to internal transfers with column addresses 256 through 511 of any given row. DRAM 110 and SAM's 122 and 124 can operate as described above either independently or in limited combination for internal data transfers. Transfer control circuit 126 controls the internal transfer of data between the SAM's and the DRAM using transfer gates 128 and 130. The address location of the SAM's are controlled through address lines A0–A8 using SAM address latch/buffer 132, SAM address counter 134 and SAM location decoder 136. SAM serial output is provided on lines SDQ1–SDQ8 through SAM output buffers 138. Likewise, serial input to the SAM's are controlled on lines SDQ1–SDQ8 through SAM input buffer 140. Split SAM status and control 137 provides SAM status feedback to the transfer control 126.

Timing generator and control logic 144 is used to control the many available functions of DRAM 110. DRAM data input is provided on lines DQ1–DQ8 through DRAM input buffers 146. MUX 151 multiplexes the DQ input lines and the color register 150 to write control logic 158. Block write control logic 148, color register 150 and column mask 152 are used to control custom features of the multi-port memory. Masked write control logic 154, masked data register 156, and write control logic 158 are used to control masking features. Sense amplifiers 160 are used to detect and amplify data stored in the DRAM.

The present invention is described in a multi-port memory, however, it will be understood that any memory incorporating a dynamic memory array and a static memory can be used without departing from the spirit of the present invention.

Input and Output Connections

The input and output connections of the multi-port memory used to communicate with a micro processor are described as follows. Serial clock input (SC) to the timing generator and control logic 144 provides the clock input for the SAM address latch/buffer 132 and SAM address counter 134 for each of the SAM memories. Transfer enable/output enable (TR*/OE*) input provides for the internal transfer of data between the DRAM and the SAM's and also enables the output buffers 120 of the DRAM. The masked enable/write enable (ME*/WE*) input is used to perform a masked write function. The ME*/WE* can also be used to select a read or write cycle when accessing the DRAM, this includes a read transfer or write transfer with the SAM's. The serial port enable (SE*) input is used to enable the SAM input buffers 140 and output buffers 138. Special function select input (DSF) is used to indicate which special function (block write, flash write, split transfer, etc.) are used for a particular access cycle. Row address strobe (RAS*) input is Used to clock in the nine row address bits and strobe for ME*/WE*, TR*/OE*, DSF, SE*, CAS*, and DQ inputs. In standard multi-port memories, the RAS* also acts as the master chip enable and must fall for the initiation of any DRAM or transfer function. Column address strobe (CAS*) input is used to clock in the nine column address bits and as a strobe for the DSF input for a block write function.

Address input lines A0–A8 are used to identify a row and column address to select at least one 8 bit word or register out of the 262,144 available words, as detailed above. DRAM data input/output lines DQ1–DQ8 provide data input and output for the DRAM and also act as inputs for mask data register 156 and color register 150. Serial data input/output lines SDQ1–SDQ8 provide data input and output to the SAM's 122 and 124. SAM's split status output (QSF) indicates which half of the SAM is being accessed, a low indicates addresses 0–255 are being accessed, while a high indicates addresses 256–511 are being addressed.

Transfer Functions

Read and write transfer functions can be performed between the DRAM and a SAM. The following method relates to a typical read transfer function used in dual port DRAMs and multiport DRAM. It also applies, however, to single port DRAM's like cache DRAMs. Data is transferred from a dynamic memory to some form of static latch or serial memory such as a SAM. This data transfer can be an entire row of data bits accessed in the dynamic memory, or a half row or a portion of a row. Further, half serial memory (or half length static cell) approaches can be used on dual port DRAMs.

To perform a read transfer, the inputs are examined during a RAS* cycle (RAS* falls). If the inputs are such that TR*/OE* is low, ME*/WE* is high, and DSF is low, a read transfer function is to be performed from a DRAM row to a SAM. The row address is present on the address pins A0–A8 when RAS* falls.

Figure 2:
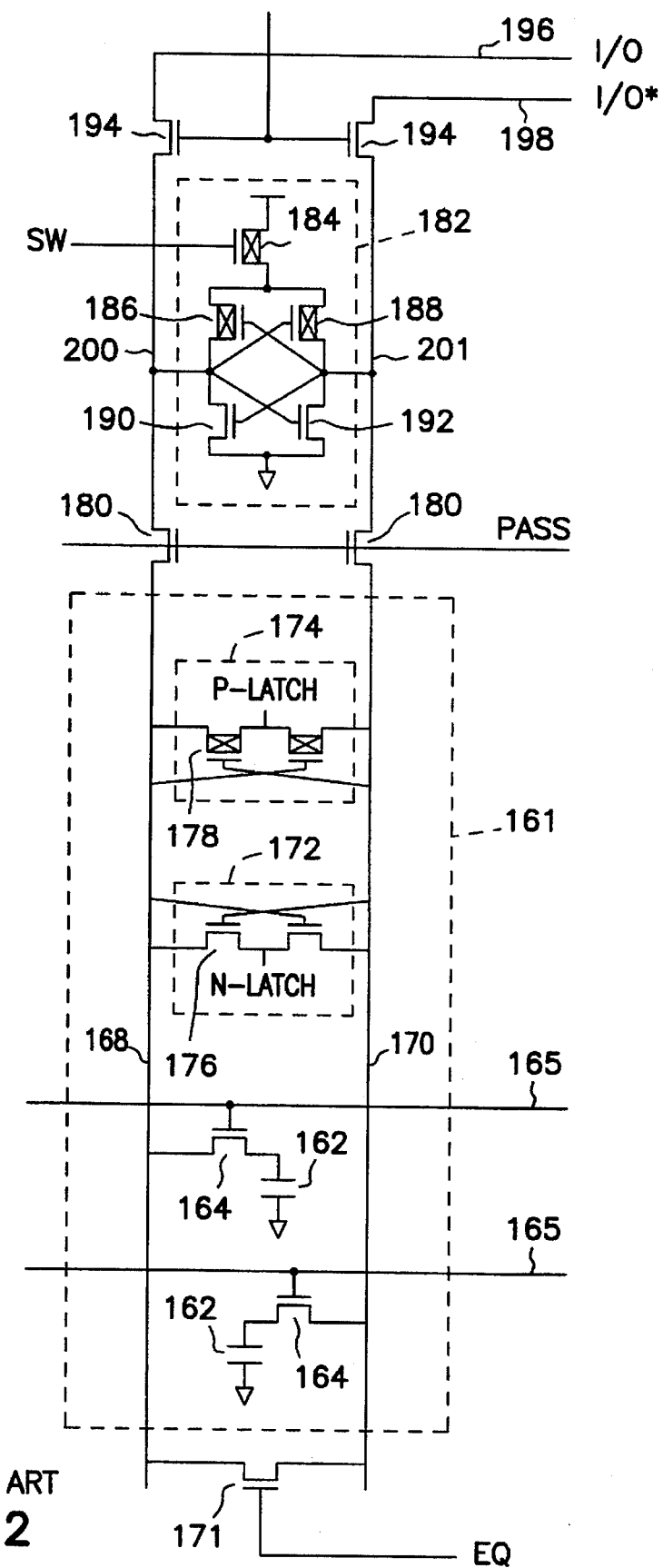
FIG. 2 is a portion of a related dynamic memory and coupled static memory.

Referring to FIG. 2, the typical sensing and transfer circuits are described. The dynamic memory 161 has memory cells 162 formed as capacitors which store data as a charge. As stated above, a logical one is typically stored as a charge on the capacitor and a logical zero is typically stored as a discharged capacitor. A n-channel access transistor 164 is connected to each memory cell such that its source is connected to a memory cell and its drain is connected to one of the digit lines 168 or 170. The access transistor is activated by raising its gate potential using one of the addressable row lines 165. The memory cells, therefore, can be electrically coupled to a digit line. An equilibrate transistor 171 is connected between the two digit lines to selectively equalize the voltage of the digit lines. An n-sense amplifier 172 and a p-sense amplifier 174 are connected to the two digit lines 168 and 170. The n-sense amplifier is comprised of a pair of cross-coupled n-channel transistors 176. The sources of these transistors are connected to a common NLatch line. The NLatch line is typically held at one-half the supply voltage (Vcc) and strobed low to sense data stored on a selected memory cell. Likewise, the p-sense amplifier is comprised of a pair of cross-coupled p-channel transistors 178. The sources of the p-channel transistors are connected to a common PLatch line which is normally held to Vcc/2 and strobed high to sense data stored on the memory cells.

Pass transistors 180 are used to connect the digit lines 168 and 170 to a static addressable memory cell 182. As explained above, the static memory can be a SAM. The static memory cell is comprised of three p-channel transistors 184, 186 and 188, and two n-channel transistors 190 and 192. I/O enable transistors 194 are provided to electrically connect one of the static memory cells 182 to I/O line 196 and its complement I/O line 198.

Figure 3:
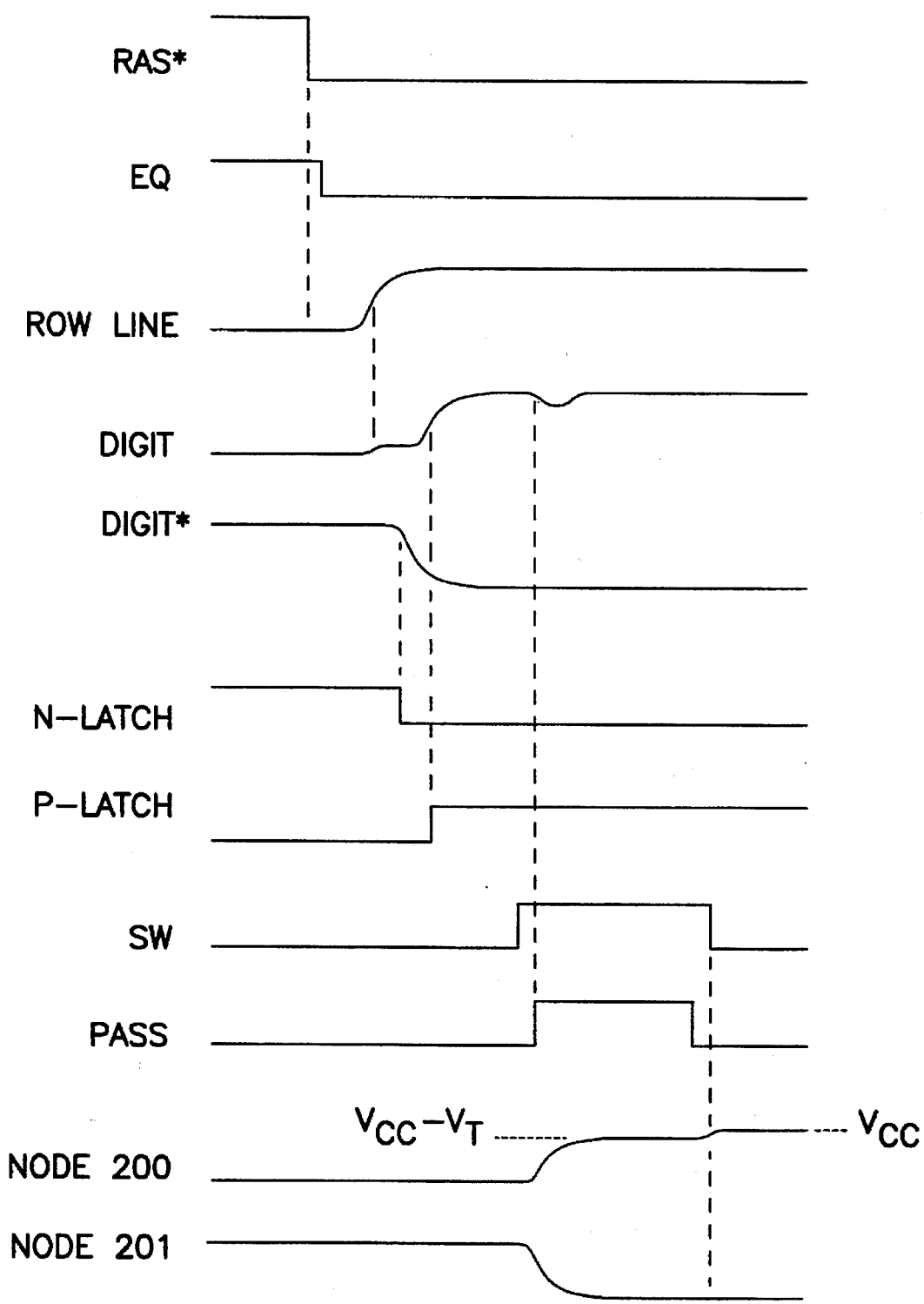
FIG. 3 is a timing diagram for the circuit of FIG. 2.

To transfer data during a RAS* cycle, the digit lines are in equilibration by the activated equilibrate transistor 171 which couple the digit lines to Vcc/2, as shown in FIG. 3. Immediately after RAS* goes low, the equilibrate transistor is turned off by lowering its gate voltage (EQ). Next, a selected word line 165 is activated and the associated access transistor 164 is turned on to connect a memory cell 162 to one of the digit lines 168 or 170. The charge shared by the memory cell with the digit line will change the digit line potential by approximately ±200 mv. The differential between the digit lines is then sensed using the n-sense 172 and p-sense 174 amplifiers, as known to one skilled in the art. The NLatch line is lowered such that the digit line with a potential, a threshold level above the NLatch level will activate one of the transistors 176 and pull the other digit line low. The p-sense amplifier is then strobed by raising the PLatch line. The digit line which was pulled low by the n-sense amplifier will activate one of the transistors 178 so that the other digit line is pulled high. After both sense amplifiers have been strobed, the digit lines are at full power rail potentials, Vcc or ground.

At some point, enough signal develops on the digit lines such that the data is ready for transfer. The read transfer sequence is begun by disabling the static memory cell's pull up capability by raising the SW signal to turn-off transistor 184. The pull down transistors 190 and 192 are not disabled. At this point the transfer gate between the dynamic memory and the static memory is activated by raising the PASS line. Thus, the activated dynamic memory is coupled to the partially deactivated static memory. In an overwrite case, where the state of the dynamic memory is different from the state of the static memory, the digit line which has a high potential activates one of the pull down transistors 190 or 192 and the other digit line turns-off the other pull down transistor 190 or 192. This pulls the high side of the static memory cell low. At this point the static memory cell has been over-written and the transfer transistors 180 are turned-off by the PASS line going low. The SW line returns low to re-enable the static memory cell pull-up transistor 184. Thus, the read transfer and over-write is complete.

Figure 4:
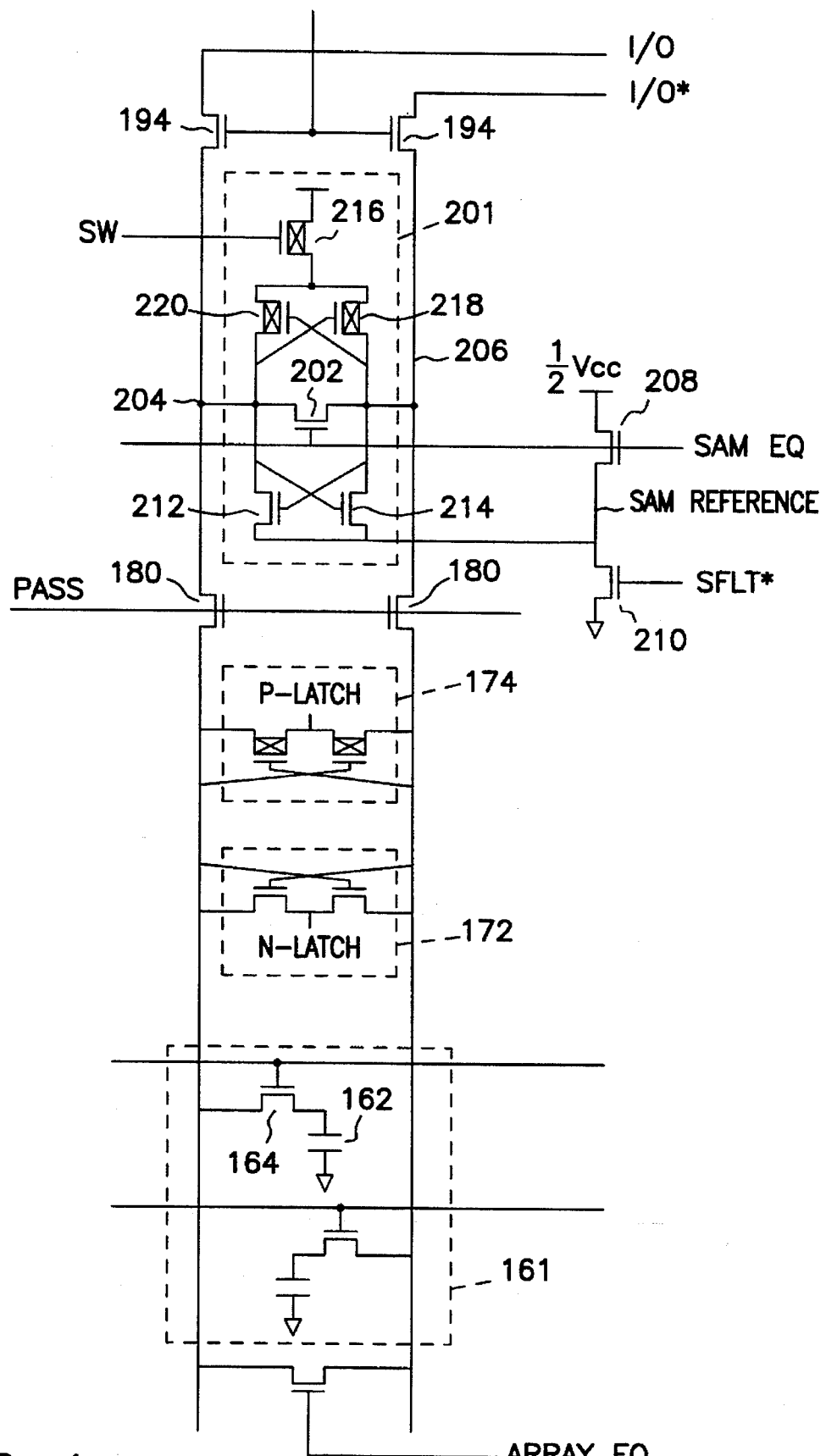
FIG. 4 is a schematic of a portion of a dynamic memory and coupled static memory incorporating the present invention.

It can be seen that to over-write data stored in the static memory cell, a substantial current is incurred by the p-sense amplifier. The present invention reduces the current used to perform a read transfer operation from a dynamic memory cell to a static memory cell. FIG. 4, illustrates one embodiment of the present invention which provides a static memory equilibrate circuit. By adding an equilibrate circuit to the static memory cell and providing a switchable lower reference voltage, the static memory can be equilibrated prior to a read transfer operation.

The integrated circuit in FIG. 4 has as dynamic memory and sense amplifiers as explained above with reference to FIG. 2. The static memory cell 201, however, includes an equilibrate transistor 202 with a source connected to node 204 and a drain connected to node 206. The equilibrate transistor has a gate connected to a SAM EQ line. The SAM EQ line is connected to transistor 208 which has a source connected to Vcc/2 and a drain connected to a pull down transistor 210. The pull down transistor has its gate connected to a static float node (SFLT*). The drain of the pull down transistor and the source of transistor 208 are both connected to the sources of transistors 212 and 214 and referred to as SAM REFERENCE. Transistors 208 and 210 are used as a bias circuit to bias the SAM REFERENCE potential between a ground potential (when the static memories are holding data) and Vcc/2 (during a read transfer).

The present invention allows the static memory cells to be deactivated and equilibrated before the transfer of new data from the dynamic memory occurs, and then reactivated after the data has been coupled to them via the digit lines. A read transfer operation can be realized which is faster than prior read transfer operations. Further, the read transfer can occur earlier in the dynamic memory sensing operation with respect to when the PLatch and NLatch are activated. The present invention also allows dynamic memory write-back to occur sooner by shortening the RAS* cycle, and thus pre-charge for the dynamic memory to occur sooner without refresh degradation. Another advantage can be found over prior static memories, in that there is no DC path to ground through the static memory cell. As stated above, the worst case transfer is when the dynamic memory has to over-write data in the static memory cell. During an over-write in a prior circuit, the p-sense amplifiers of the dynamic memory had to shunt current through the cross coupled n-channel transistors 190 and 192 to the ground reference. The SAM REFERENCE line of the present invention eliminates the DC current path. This results in a significant current reduction, where the new current used is less than half of prior circuits.

Figure 5:
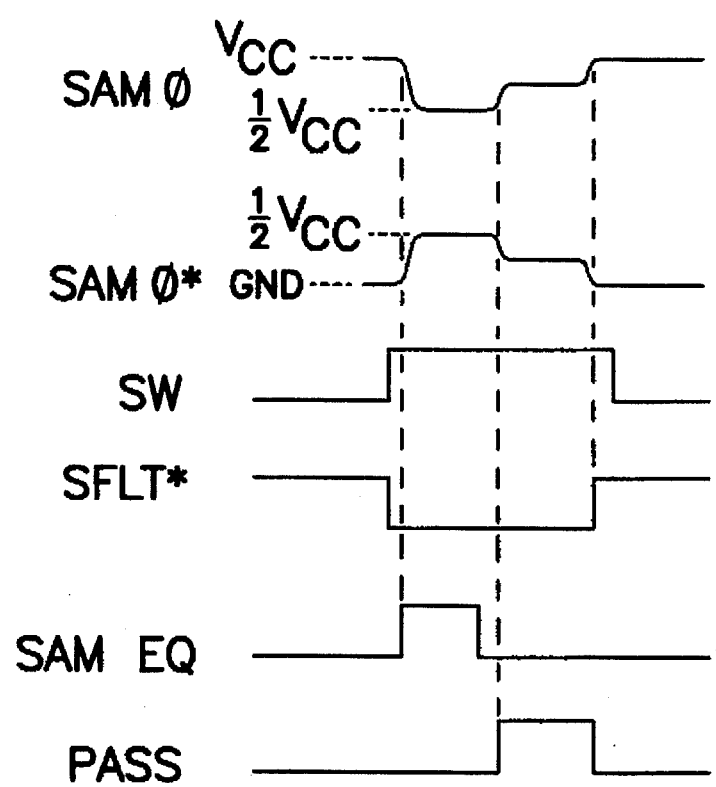
FIG. 5 is a timing diagram of the static memory circuitry of FIG. 4.

Referring to FIG. 5, the timing of the static memory cell during a read transfer operation using the present invention is explained. The static memory cell nodes 204 and 206, referred to as SAM 0 and SAM 0*, respectively, are latched at opposite states. To perform a read transfer, the SW line is raised to disable the pull-up transistor 216. At the same time, the SFLT* node goes low to disconnect transistors 212 and 214 from ground. The SAM EQ line then goes high to activate transistors 208 and 202. SAM 0 and SAM 0* are thereby equalized to Vcc/2 through transistors 212 and 214. SAM EQ goes low and the PASS line then goes high to connect the dynamic memory to the static memory cell. After a differential voltage has been developed on nodes 204 and 206, the PASS line goes low to isolate the static memory cell from the digit lines. The SFLT* node then goes high to pull the sources of transistors 212 and 214 low. These cross coupled n-channel transistors behave as an n-sense amp and latch one node low. The SW line then goes low to pull the sources of transistors 218 and 220 high which behave like a sense amp and pull the other node high.

Figure 6:
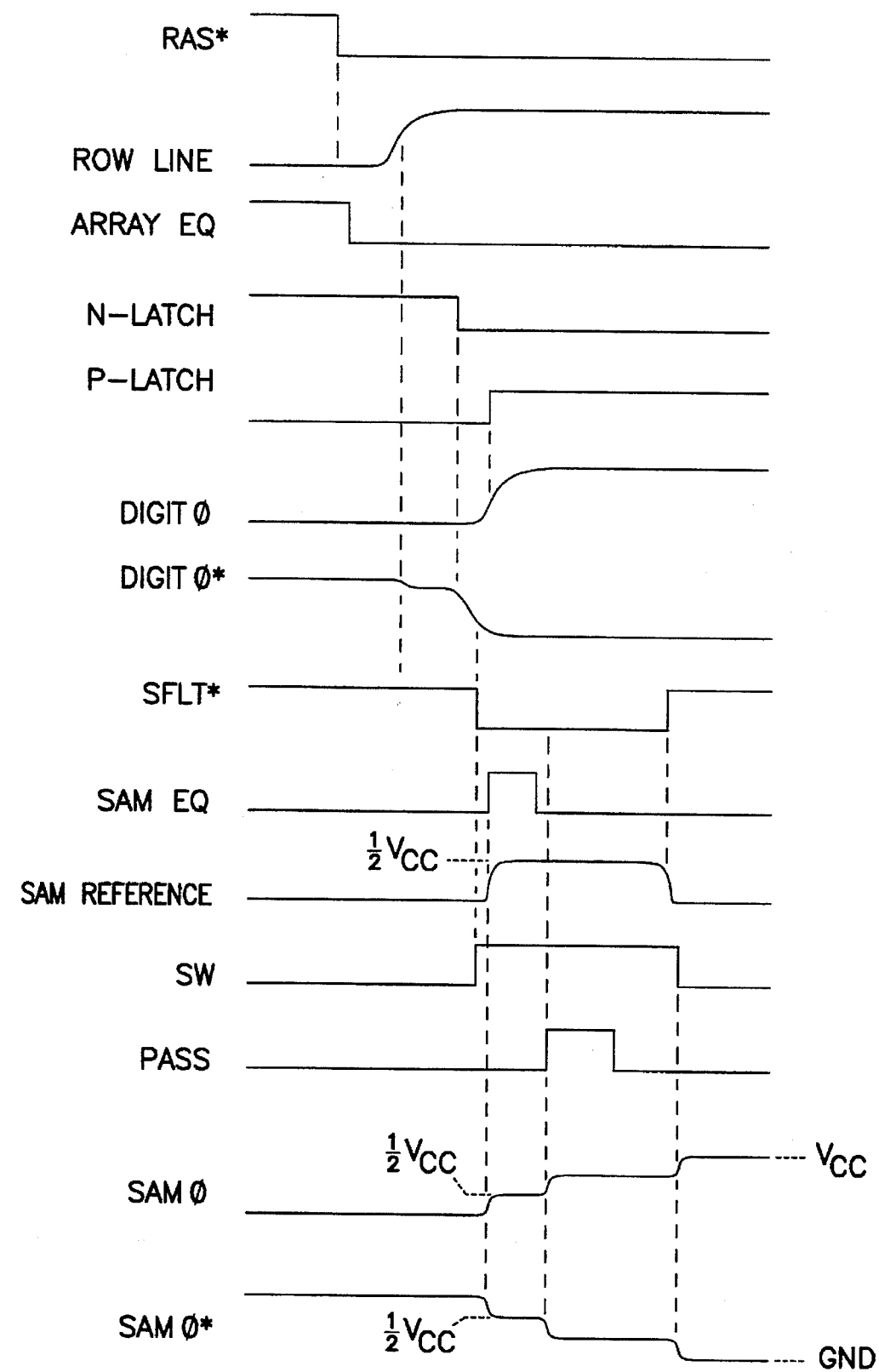
FIG. 6 is a timing diagram of a read transfer operation of FIG. 4.

FIG. 6, illustrates the timing of a multiport memory incorporating the present invention during a read transfer operation. The RAS* line goes low to both indicate that a read transfer operation is to be conducted and specify a row address in the dynamic memory. The digit lines of the dynamic memory array which contain the addressed row end equilibration (Array EQ). The word line, or row line, associated with the addressed row is then charged to a high level. When the word line reaches a sufficient level, the access transistor connected to the addressed memory cell is activated. The charge stored on the dynamic memory cell is then shared with one of the digit lines, Digit 0 or Digit 0*. In this illustration, the addressed dynamic memory cell is connected to the Digit 0* line and lowers the line potential from its equilibrated level. The NLatch line is strobed low so that the digit line having a lower level will begin to be pulled low. After the NLatch line goes low, the SFLT* node goes low to disable the pull down transistors 212 and 214 of the static memory cell. The SW line goes high to disable the pull up transistors 218 and 220 of the static memory cell. The SAM EQ line is pulsed high to equalize the static memory cell nodes SAM 0 and SAM 0* to Vcc/2 by pulling the SAM REFERENCE line to Vcc/2. After the static memory is equalized, the PASS line is pulsed high to connect the two memories. It will be realized that the dynamic memory and the static memory can be operated independently until the SFLT* line goes low. This can be used to allow the static memory equalization process to proceed while the dynamic memory sensing function is being performed. The SAM 0 and SAM 0* nodes are coupled to the Digit 0 and Digit 0* lines. The SFLT* node and SW line are toggled after the PASS line returns low to force the static memory cell nodes to full power rails, as detailed above. By lowering the PASS line prior to toggling the SFLT* node and SW line, the static memory and the dynamic memory can be operated independently. It will be understood, however, that the PASS line can remain high while the SFLT* node and SW line are toggled. The static memory and the sense amplifiers would then work together to drive the digit lines to the power rails.

It will be understood that the dynamic memory sense amps do not have to overwrite the static memory cell. By equilibrating the static memory, data can be transferred from the dynamic memory to the static memory as soon as a differential voltage in the order of 100-200 mv is present on the digit lines. That is, the digit lines do not have to be at full rail to transfer data. Prior read transfer operations required the dynamic memory sense amplifiers to swing the voltage levels inside the static memory cell. These voltage swings were approximately 2-3 volts and placed a heavy current drain on the digit line sense amps. The current requirements become apparent when a dynamic memory must over-write several thousand static memory cells. Because of this large current drain, read transfers are the most power hungry cycle/mode on a VRAM.

Further, prior read transfer operations created a voltage drop or dip in one of the digit lines due to the DC current path to ground. The present invention both eliminates the DC path and shortens the PASS pulse width, which contributes to a faster RAS* cycle time when doing read transfers. Because a dip in one of the digit lines could toggle the dynamic memory, the present circuit is also more stable.

Conclusion

A circuit and method have been described for equilibrating a static memory for receiving data transferred from a dynamic memory. The static memory includes circuitry for equilibrating the static memory to a predetermined potential such that the dynamic memory can transfer data using a differential technique instead of the prior method of actively forcing the static memory to change states in an over-write operation.

What is claimed is:

1. An integrated memory circuit comprising:
   a plurality of dynamic memory cells;
   a plurality of static memory cells selectively coupled to the plurality of dynamic memory cells, each of the static memory cells having first and second nodes and comprising:
      a first transistor having a gate connected to the second node, a drain connected to the first node, and a source connected to a drain of a grounding transistor, and
      a second transistor having a gate connected to the first node, a drain connected to the second node, and a source connected to the drain of the grounding transistor;
   the grounding transistor having a source coupled to ground potential, and a gate connected to receive an activation signal; and
   an equilibrate circuit directly connected to the plurality of static memory cells for equilibrating the plurality of static memory cells to a predetermined potential, the equilibrate circuit comprising a first equilibrate transistor having a drain connected to the first node, a source connected to the second node, and a gate connected to receive an equilibration signal; the equilibrate circuit further comprising a second equilibrate transistor having a drain connected to receive an equilibrate voltage, a source connected to the drain of the grounding transistor, and a gate connected to receive the equilibration signal.

2. An integrated memory circuit comprising:

a plurality of dynamic memory cells;

a digit line selectively coupled to the plurality of dynamic memory cells;

sense amplifiers connected to the digit line;

a static memory cell selectively coupled to the digit line, the static memory cell comprising first and second nodes; and an equilibrate circuit directly connected to the first and second nodes for equilibrating the static memory cell to a predetermined potential, the static memory cell comprising:

a first transistor having a gate connected to the second node, a drain connected to the first node, and a source connected to a drain of a grounding transistor, and a second transistor having a gate connected to the first node, a drain connected to the second node, and a source connected to the drain of the grounding transistor, the grounding transistor having a source coupled to ground potential, and a gate connected to receive an activation signal; and the equilibrate circuit comprising:

a first equilibrate transistor having a drain connected to the first node, a source connected to the second node, and a gate connected to receive an equilibration signal, and a second equilibrate transistor having a drain connected to receive an equilibrate voltage, a source connected to the drain of the grounding transistor, and a gate connected to receive the equilibration signal.

3. A multi-port memory comprising:

a dynamic random access memory (DRAM) having a plurality of dynamic memory cells selectively coupled to a digit line;

a p-sense amplifier and an n-sense amplifier connected to the digit line;

a serial access memory (SAM) having a plurality of static memory cells selectively coupled to the digit line, each of the static memory cells having first and second nodes and comprising:

a first transistor having a gate connected to the second node, a drain connected to the first node, and a source connected to a drain of a grounding transistor, and a second transistor having a gate connected to the first node, a drain connected to the second node, and a source connected to the drain of the grounding transistor, the grounding transistor having a source coupled to ground potential, and a gate connected to receive an activation signal; and an equilibrate circuit directly connected to the plurality of static memory cells for equilibrating the plurality of static memory cells to a predetermined potential, the equilibrate circuit comprising:

a first equilibrate transistor having a drain connected to the first node, a source connected to the second node, and a gate connected to receive an equilibration signal, and a second equilibrate transistor having a drain connected to receive an equilibrate voltage, a source connected to the drain of the grounding transistor, and a gate connected to receive the equilibration signal.

4. A method of transferring data from a dynamic memory to a static memory, the static memory having a static memory cell with first and second nodes, the static memory cell having a first transistor having a gate connected to the second node, a drain connected to the first node, and a source connected to a drain of a grounding transistor, and a second transistor having a gate connected to the first node, a drain connected to the second node, and a source connected to the drain of the grounding transistor, the grounding transistor having a source coupled to ground potential, and a gate connected to receive an activation signal, the method comprising the steps of:

electrically isolating the static memory from the dynamic memory;

equilibrating the electrically isolated static memory by activating a first equilibrate transistor connected between the first and second nodes, and activating a second equilibrate transistor connected between the drain of the grounding transistor and an equilibrate voltage;

electrically coupling the static memory to the dynamic memory;

imparting a differential voltage on the static memory; and storing the data in the static memory.

5. The method of claim 4 wherein the step of electrically isolating the static memory comprises the step of:

deactivating isolation transistors located between the static memory and the dynamic memory.

6. The method of claim 4 wherein the step of electrically coupling the static memory to the dynamic memory comprises the step of:

activating isolation transistors located between the static memory and the dynamic memory.

* * * * *